(12) United States Patent
Luo

(10) Patent No.: US 7,332,968 B2
(45) Date of Patent: Feb. 19, 2008

(54) AMPLIFIER CIRCUIT HAVING AN IMPEDANCE-CONTROLLABLE BIAS-BOOSTING CIRCUIT

(76) Inventor: Sifen Luo, 13309 Deerbrook Dr., Potomac, MD (US) 20854

( * ) Notice: Subject to any disclaimer, the term of this patent is extended or adjusted under 35 U.S.C. 154(b) by 167 days.

(21) Appl. No.: 10/537,574

(22) PCT Filed: Dec. 3, 2003

(86) PCT No.: PCT/IB03/05620

§ 371 (c)(1),
(2), (4) Date: Jun. 6, 2005

(87) PCT Pub. No.: WO2004/054093

PCT Pub. Date: Jun. 24, 2004

(65) Prior Publication Data
US 2006/0033576 A1    Feb. 16, 2006

Related U.S. Application Data

(60) Provisional application No. 60/431,840, filed on Dec. 9, 2002.

(51) Int. Cl.
*H03F 3/04* (2006.01)
(52) U.S. Cl. .................................................. 330/296
(58) Field of Classification Search ............... 330/288, 330/296
See application file for complete search history.

(56) References Cited

U.S. PATENT DOCUMENTS

| 5,548,248 | A | 8/1996 | Wang |
| 5,844,443 | A | 12/1998 | Wong |
| 6,064,268 | A * | 5/2000 | Felps ..................... 330/288 |
| 6,300,837 | B1 | 10/2001 | Sowlati |
| 6,358,516 | B1 | 3/2002 | Harod |
| 6,414,553 | B1 | 7/2002 | Luo |
| 6,486,739 | B1 * | 11/2002 | Luo ..................... 330/288 |
| 6,492,875 | B2 | 12/2002 | Luo |

* cited by examiner

*Primary Examiner*—Steven J. Mottola

(57) ABSTRACT

An amplifier circuit (1) includes an amplifying transistor (QØ) and an impedance-controllable dc bias circuit (2) for biasing the amplifier transistor (QØ) to obtain a conduction angle of at least about 180°. The dc bias circuit (2) includes a self-bias boosting circuit having separate current sources (Ibias, Iclass) for independently controlling the output impedance of the dc bias circuit (2) and the quiescent current of the amplifier transistor (QØ), and has a Wilson current-mirror (Q4, Q5, Q6, Q7) integrated with a cascode current-mirror circuit (Q2, Q3, Q8) to form an extended Wilson current-mirror circuit (Q2-Q8) having an output coupled to a control terminal of the amplifying transistor (QØ) by a resistor (R1), and a capacitor (C2) coupled from the extended Wilson current-mirror circuit (Q2-Q8) to a common terminal (Gnd).

6 Claims, 1 Drawing Sheet

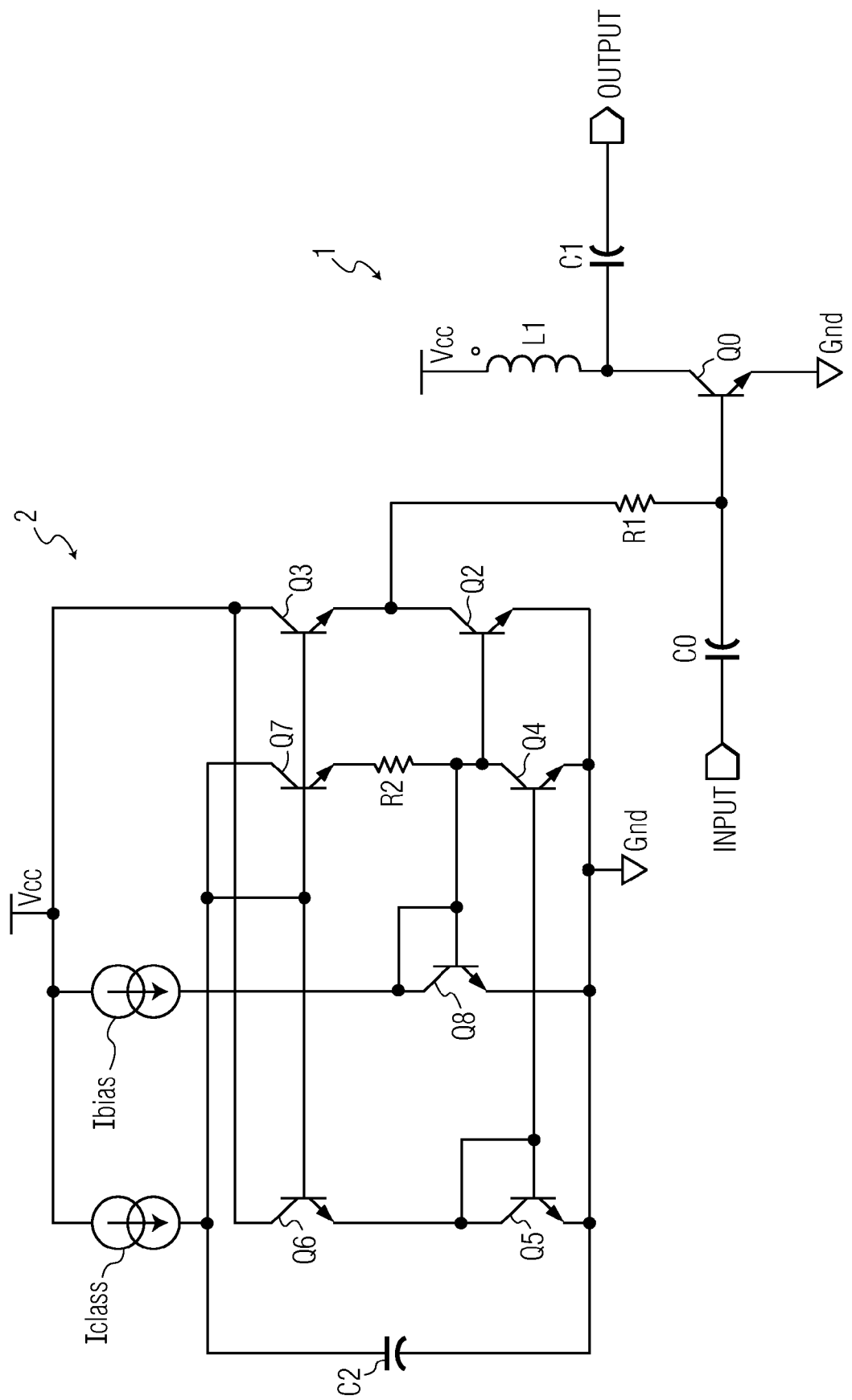

AMPLIFIER CIRCUIT HAVING AN IMPEDANCE-CONTROLLABLE BIAS-BOOSTING CIRCUIT

CROSS REFERENCE TO RELATED APPLICATION

This application claims the benefit of U.S. provisional application Ser. No. 60/431,840 filed Dec. 9, 2002, which is incorporated herein by reference.

The invention is in the field of transistor amplifier circuits, and relates more particularly to a power amplifier circuit having an impedance-controllable bias boosting circuit.

The invention is in the field of transistor amplifier circuits, and relates more particularly to a power amplifier circuit having an impedance-controllable bias boosting circuit.

Amplifiers of this general type are frequently used in high-frequency RF amplifiers, such as for telecommunications applications, as well as in audio amplifiers and other applications. In order to obtain a linear input-output relationship and high operating efficiency, such amplifiers are typically operated with a conduction angle of about 180° (Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output. To avoid this power reduction, the amplifier must have a larger quiescent bias. In prior-art circuitry this inevitably leads to a higher power dissipation at low power output levels and therefore an undesirable tradeoff in operating characteristics.

To achieve higher power-added efficiency (PAE), amplifiers, and in particular linear RF amplifiers, are typically biased in Class AB, with the bias to the amplifying transistor being boosted to improve linearity at higher output power levels where the amplifier is operated in or near saturation.

A recent improvement in this art is disclosed in commonly-assigned U.S. Pat. No. 6,300,837, entitled Dynamic Bias Boosting Circuit For A Power Amplifier. This patent discloses a solution to the problem discussed above which entails providing the power amplifier circuit with a dynamic bias boosting circuit to dynamically increase the bias of the power transistor as the output power increases by using a circuit that senses the input voltage to the amplifier and generates a dynamic bias boost as a function of the amplitude of this signal. The drawback to this solution is that it employs numerous active and passive components, thus not maximizing simplicity, compactness and economy of manufacture.

Another recent improvement in this area is disclosed in co-pending and commonly-assigned allowed U.S. patent application Ser. No. 09/730,657, entitled Self-Boosting Circuit For A Power Amplifier, filed on Dec. 6, 2000. This application presents an improved self-bias boosting circuit having an RC coupling network between the DC bias circuit and the amplifying transistor while using a generic DC bias circuit. A similar RC coupling network in conjunction with a cascode current-mirror bias boosting circuit is shown in commonly-assigned U.S. Pat. No. 6,414,553.

A scheme for independently controlling quiescent current and bias impedance is disclosed in High-Frequency Amplifier Circuit With Independent Control Of Quiescent Current And Bias Impedance, commonly-assigned U.S. Pat. No. 6,358,516. Although this scheme is capable of achieving high power-added efficiency while maintaining linearity, it employs a rather complex circuit and contributes a significant level of noise to the output stage.

All of the foregoing references are hereby incorporated by reference in their entirety.

Accordingly, it would be desirable to have a power amplifier circuit which offers the advantages of optimum maximum output power and gain while keeping the idle current of the amplifying stage relatively low. Additionally, the circuit should be able to establish the amount of self-bias boosting so that the power transistor can be properly biased for high power output and linearity as the power output increases, without the use of a boosting capacitor, while controlling the quiescent current in the power transistor. Furthermore, the circuit should be capable of independently controlling both quiescent current in the amplifying transistor (class of operation) and drive current for the amplifying transistor (bias impedance). Finally, it would be desirable for such a circuit to be simple and compact in design, and economical to manufacture.

It is therefore an object of the present invention to provide an amplifier circuit which provides improved maximum output power and gain while keeping the idle current of the amplifying stage relatively low. It is a further object of the invention to provide a circuit which is able to establish the amount of self-bias boosting so that the amplifying transistor can be properly biased for high power output and linearity as the power output increases, without the use of a boosting capacitor, while controlling the idle current in the amplifying transistor. A further object of the invention is to provide a circuit which is capable of independently controlling both quiescent current in the amplifying transistor (class of operation) and drive current for the amplifying transistor (bias impedance). Yet a further object of the invention to provide a circuit which is both simple and compact in design and which is economical to manufacture.

In accordance with the invention, these objects are achieved by a new amplifier circuit for amplifying an input signal and having a conduction angle of at least about 180°, the amplifier circuit including an amplifying transistor and an impedance controllable dc bias circuit for biasing the amplifier transistor to obtain the desired conduction angle. The dc bias circuit includes a self-bias boosting circuit having a "bias" current source for controlling the output impedance of the circuit and a "class" current source for independently controlling the quiescent current of the amplifying transistor. The self-bias boosting circuit has a Wilson current-mirror integrated with a cascode current-mirror circuit to form an extended Wilson current mirror circuit having an output coupled to a control terminal of the amplifying transistor by a resistor, and a capacitor coupled from the cascode current-mirror circuit to a common terminal.

In a preferred embodiment of the invention, the cascode current-mirror circuit includes a first pair of transistors having main current paths connected in series, with the output of the current-mirror circuit being taken from a common point of this series connection, a second pair of transistors having main current paths connected in series, and a third pair of transistors having main current paths connected in series, with a "bias" current source and a "class" current source being used to provide independent control of output impedance and quiescent current.

An amplifier circuit in accordance with the present invention offers a significant improvement in that a particularly advantageous combination of features, including increased maximum output power and gain, improved linearity, selectable self-bias boosting level, independently controllable quiescent current and output impedance, and reduced idle current, can be obtained in a simple, compact and economical configuration.

These and other aspects of the invention will be apparent from and elucidated with reference to the embodiments described hereinafter.

The invention may be more completely understood with reference to the following description, to be read in conjunction with the accompanying drawing, in which the single FIGURE shows a simplified schematic diagram of an RF power amplifier circuit in accordance with a preferred embodiment of the invention.

A simplified schematic diagram of an amplifier circuit 1 is shown in the single FIGURE of the drawing. The amplifier circuit includes an amplifying transistor QØ and a dc bias circuit 2 coupled to the base of the amplifying transistor QØ by a resistor R1. The bias circuit 2 includes bipolar transistors Q2 and Q3, coupled in series between $V_{CC}$ and a common terminal (Gnd), with the common point of the transistors being coupled to the base of transistor QØ by resistor R1. The basic circuit configuration is completed by an input coupling capacitor C0 for coupling an Input to the base of amplifying transistor QØ, with the transistor QØ being connected in a common-emitter configuration and coupled between Vcc and Gnd by an inductor L1. The Output of power amplifier circuit 1 is taken from the collector of transistor QØ through a capacitor C1.

In connection with the circuit shown, it should be understood that although the active components are shown as bipolar transistors for illustrative purposes, field effect transistors or a combination of bipolar and field effect transistors may alternatively be used within the scope of the invention. Additionally, it is to be understood that the power amplifier circuit 1 and bias circuit 2 may differ in form and detail from the simplified, illustrative depictions shown in the drawing. Furthermore, it is to be understood that the bias supply may be configured and adjusted to permit the amplifier circuit to operate in either Class B or Class AB mode.

The bias circuit 2 (transistors Q2-Q8) comprises a Wilson current-mirror including transistors Q4, Q5, Q6 and Q7, current source Ibias, current source Iclass and resistor R2, integrated with a cascode current mirror including transistors Q2, Q3 and Q8, and capacitor C2, which is a bypass capacitor. Transistors Q2-Q8 form an extended Wilson current-mirror. The collector node of QØ is the output node and is connected to a supply voltage through an external pull-up inductor L1. An Input is applied to the base of QØ through an AC coupling capacitor C0 that can be part of a matching circuit to a drive stage.

The bias circuit (2) is controlled by the 2 current sources, Ibias and Iclass. Whereas Ibias controls the output drive current and hence the output impedance of the bias circuit, Iclass controls the quiescent current of the amplifying transistor (QØ) and hence its class of operation. In this manner, the class of operation and the bias impedance of the output stage can be easily and independently controlled by externally controlling the 2 current sources.

The mechanism for controlling the quiescent current of QØ can be explained as follows. Assume that all transistors in the circuits are identical and perfectly matched. Kirchoff's Law dictates that DC voltage Vbe(QØ)+V(R1)+Vbe(Q3) must be equal to Vbe(Q2)+V(R2)+Vbe(Q7). As Vbe(Q3) is approximately equal to Vbe(Q2), Vbe(QØ) is therefore approximately equal to Vbe(Q7) when V(R1) is set equal to V(R2) by properly choosing the resistance values. Since the collector current of Q7 is controlled by Iclass, therefore Iclass dictates the quiescent current in QØ.

With the same assumption made above, the mechanism by which Ibias controls the output impedance of the biasing circuit can be readily explained. Since Q2, Q3 and Q8 form a simple current mirror, the current source Ibias flowing in Q8 must also flow in Q2 and hence Q3. The output impedance of the biasing circuit is predominately determined by Q3, controlled by Ibias.

By properly scaling the emitter area ratios between transistor pairs, the quiescent current in QØ and drive currents in Q2 and Q3 can be made directly proportional to the values of Iclass and Ibias, respectively. In the example given here, the ratios of 32 to 1 (QØ to Q7) and 4 to 1 (Q2 and Q3 to Q4-Q8) can be used.

The mechanism of the self-bias boosting of the bias circuit shown in the FIGURE can be explained as follows. Q3 charges QØ and Q2 discharges QØ through the resistor R1. The discharging rate of Q2 is much faster than or equal to the charging rate of Q3 when the input power is low. As the input power increases, the discharging rate of Q2 becomes slower than the charging rate of Q3. Therefore the average voltage across the forward-biased PN junction of QØ increases.

In the foregoing manner, the present invention provides an amplifier circuit with a self-bias boosting circuit which provides improved maximum output power and gain while keeping the idle current of the amplifying stage relatively low. In addition, the amplifier circuit is able to set the amount of self-bias boosting so that the amplifying transistor can be properly biased for high power output and linearity as the power output increases, without the use of a boosting capacitor, while controlling the idle current in the amplifying transistor. The circuit is both simple and compact in design, and is economical to manufacture. Furthermore, the circuit is capable of independently controlling both quiescent current in the amplifying transistor (class of operation) and drive current for the amplifying transistor (bias impedance).

While the invention has been particularly shown and described with reference to a preferred embodiment thereof, it will be understood by those skilled in the art that various changes in form and detail, some of which have been suggested above, may be made without departing from the spirit or scope of the invention. Thus, for example, different types of transistors may be employed, and alterations to the circuit configuration may be made to suit particular design requirement.

The invention claimed is:

1. An amplifier circuit for amplifying an input signal and having a conduction angle of at least about 180°, said amplifier circuit comprising an amplifying transistor and an impedance-controllable dc bias circuit for biasing said amplifying transistor to obtain said conduction angle, said dc bias circuit having a self-bias boosting circuit having means for independently controlling an output impedance of the dc bias circuit and a quiescent current of the amplifier transistor and comprising a Wilson current-mirror integrated with a cascode current-mirror circuit to form an extended Wilson current-mirror circuit having an output coupled to a control terminal of said amplifying transistor by a resistor, and a capacitor coupled from said extended Wilson current-mirror circuit to a common terminal.

2. An amplifier circuit as in claim 1, wherein said amplifier circuit is a Class AB amplifier circuit.

3. An amplifier circuit as in claim 1, wherein said cascode current-mirror circuit comprises a first pair of transistors having main current paths connected in series, said output being taken from a common point of said series connection, a second pair of transistors having main current paths connected in series, and a third pair of transistors having their main current paths connected in series, with a "bias" current source being coupled from a power supply terminal of the amplifier to a control electrode of a first transistor of said first pair of transistors for controlling said output impedance, and a "class" current source being coupled from said power supply terminal to said first, second and third pairs of transistors for controlling said quiescent current.

4. An amplifier circuit as claimed in claim 3, further comprising a resistor coupled in series with and between said third pair of transistors.

5. An amplifier circuit as in claim 4, wherein the main current paths of said first, second and third pairs are each connected to said common terminal.

6. An amplifier circuit as in claim 5, further comprising a diode-connected transistor being connected between said "bias" current supply and said common terminal.

\* \* \* \* \*